(12) United States Patent
Kikuchi et al.

(10) Patent No.: US 12,522,926 B2
(45) Date of Patent: Jan. 13, 2026

(54) SUBSTRATE PROCESSING METHOD AND SUBSTRATE PROCESSING APPARATUS

(71) Applicant: TOKYO ELECTRON LIMITED, Tokyo (JP)

(72) Inventors: Yusuke Kikuchi, Yamanashi (JP); Masato Shinada, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 484 days.

(21) Appl. No.: 18/193,569

(22) Filed: Mar. 30, 2023

(65) Prior Publication Data

US 2023/0323538 A1 Oct. 12, 2023

(30) Foreign Application Priority Data

Apr. 11, 2022 (JP) ................. 2022-065326

(51) Int. Cl.
*C23C 16/46* (2006.01)
*C23C 16/455* (2006.01)
*C23C 16/458* (2006.01)

(52) U.S. Cl.
CPC ...... *C23C 16/466* (2013.01); *C23C 16/45561* (2013.01); *C23C 16/4584* (2013.01); *C23C 16/4586* (2013.01)

(58) Field of Classification Search
CPC ............ C23C 16/4586; C23C 16/4584; C23C 16/466; H01L 21/67248
See application file for complete search history.

(56) References Cited

U.S. PATENT DOCUMENTS

| 2012/0160808 | A1* | 6/2012 | Kikuchi | H01L 21/6831 |
| | | | | 156/345.52 |
| 2020/0093027 | A1 | 3/2020 | Abarra | |
| 2020/0243355 | A1* | 7/2020 | Makabe | H01L 21/67109 |
| 2022/0220606 | A1 | 7/2022 | Takeyama et al. | |
| 2022/0406576 | A1* | 12/2022 | Otsuki | H01L 21/6875 |

FOREIGN PATENT DOCUMENTS

| JP | H07-201956 A | 8/1995 |
| JP | 2008112751 A | 5/2008 |
| JP | 2015-023041 A | 2/2015 |
| JP | 2020-047624 A | 3/2020 |
| JP | 2020-072249 A | 5/2020 |
| JP | 2021034695 A | 3/2021 |

* cited by examiner

*Primary Examiner* — P. Macade Nichols
(74) *Attorney, Agent, or Firm* — Fenwick & West LLP

(57) ABSTRACT

There is provided a substrate processing method for a substrate processing apparatus. The substrate processing apparatus comprises: a processing chamber; a placing stand provided inside the processing chamber, configured to place a substrate on a placing surface, and having a gas path; a freezing device having a contact surface to be in contact with or separated from a surface to be contacted of the placing stand and configured to cool the placing stand; a gas supply pipe connected to the gas path and configured to introduce a heat transfer gas; and a cooling part provided outside the processing chamber and connected to the gas supply pipe. The substrate processing method comprises: (a) cooling the heat transfer gas by the cooling part; and (b) supplying the cooled heat transfer gas between the placing surface and a back surface of the substrate from the gas path through the gas supply pipe.

9 Claims, 6 Drawing Sheets

SUBSTRATE PROCESSING METHOD AND SUBSTRATE PROCESSING APPARATUS

CROSS-REFERENCE TO RELATED APPLICATIONS

This application claims priority to Japanese Patent Application No. 2022-065326 filed on Apr. 11, 2022, the entire contents of which are incorporated herein by reference.

TECHNICAL FIELD

The present disclosure relates to a substrate processing method and a substrate processing apparatus.

BACKGROUND

For example, Japanese Laid-open Patent Publication No. 2021-34695 (Patent Document 1) proposes, as a technique for uniformly cooling a substrate to an extremely low temperature in an ultrahigh vacuum environment, a technique for supplying cold heat from a refrigerator to a stage through a refrigerant heat transfer body while supplying cooling gas to a gap between the rotating stage and the refrigerant heat transfer body. Patent Document 1 further discloses that a plurality of substrates are continuously processed after the stage is preheated to a predetermined temperature.

For example, Japanese Laid-open Patent Publication No. 2008-112751 (Patent Document 2) proposes a technique for adjusting a pressure of a backside gas supplied to a gap between a surface of an electrostatic chuck and a back surface of a substrate so that the substrate is electrostatically attracted by the electrostatic chuck provided on a top of a placing stand and a temperature of the substrate reaches a specified temperature.

SUMMARY

The present disclosure provides a technique capable of improving cooling efficiency between a substrate and a placing stand.

In accordance with an aspect of the present disclosure, there is provided a substrate processing method for a substrate processing apparatus. The substrate processing apparatus comprises: a processing chamber; a placing stand provided inside the processing chamber, configured to place a substrate on a placing surface, and having a gas path; a freezing device having a contact surface to be in contact with or separated from a surface to be contacted of the placing stand and configured to cool the placing stand; a gas supply pipe connected to the gas path and configured to introduce a heat transfer gas; and a cooling part provided outside the processing chamber and connected to the gas supply pipe. The substrate processing method comprises: (a) cooling the heat transfer gas by the cooling part; and (b) supplying the cooled heat transfer gas between the placing surface and a back surface of the substrate from the gas path through the gas supply pipe.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
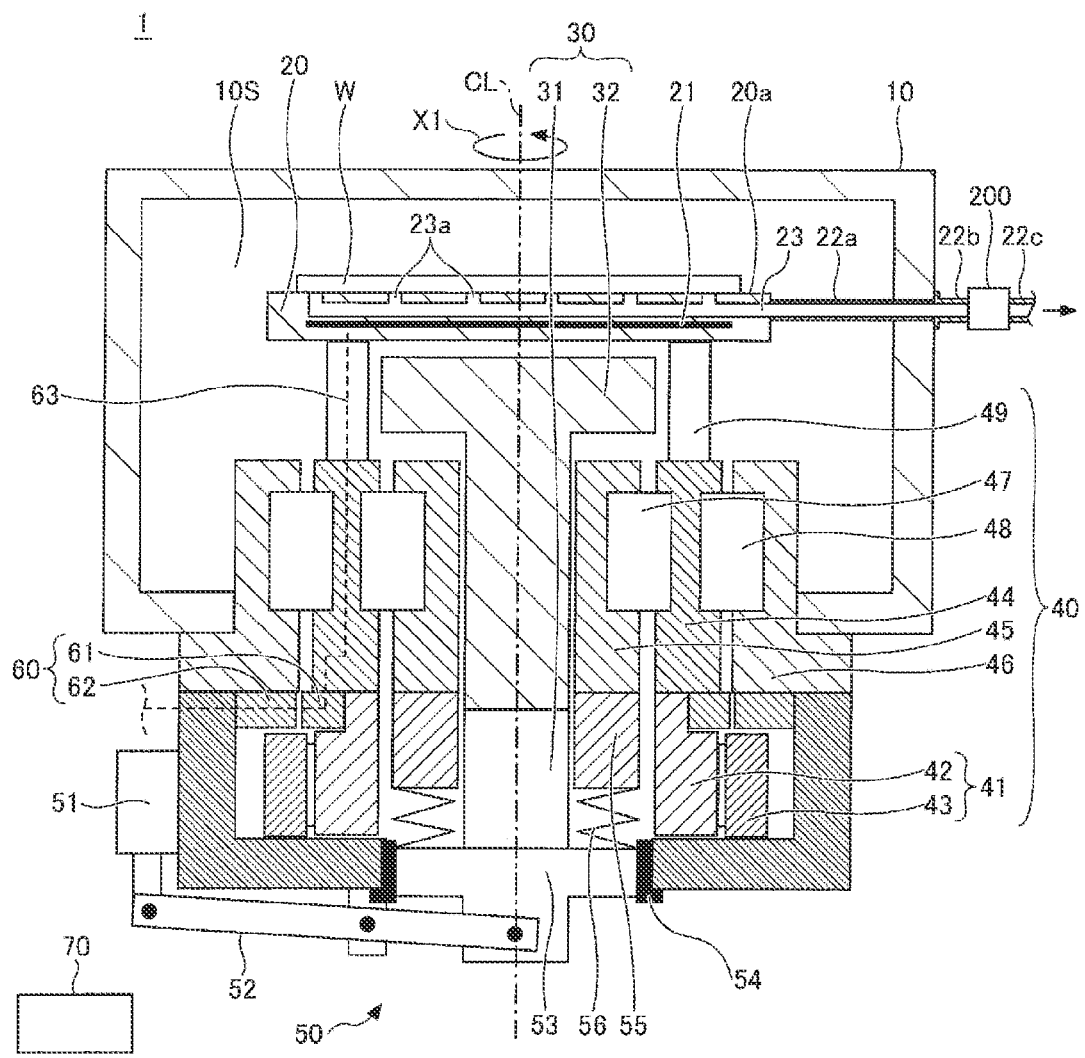
FIG. 1 is a cross-sectional view showing an exemplary configuration when a placing stand of a substrate processing apparatus according to an embodiment is rotated.

Hereinafter, embodiments for carrying out the present disclosure will be described with reference to the drawings. In each drawing, the same components are denoted by the same reference numerals, and redundant description thereof may be omitted.

In the present specification, directions such as parallel, right angle, orthogonal, horizontal, vertical, up and down, left and right, and the like are allowed to deviate to the extent that the effects of the embodiments are not impaired. The shape of the corners is not limited to a right angle and may be rounded in an arc. The terms "parallel", "right angle", "orthogonal", "horizontal", "vertical", "circular", and "coincident" may include "substantially parallel", "substantially right angle", "substantially orthogonal", "substantially horizontal", "substantially vertical", "substantially circular", and "substantially coincident", respectively.

(Substrate Processing Apparatus)

Figure 2:
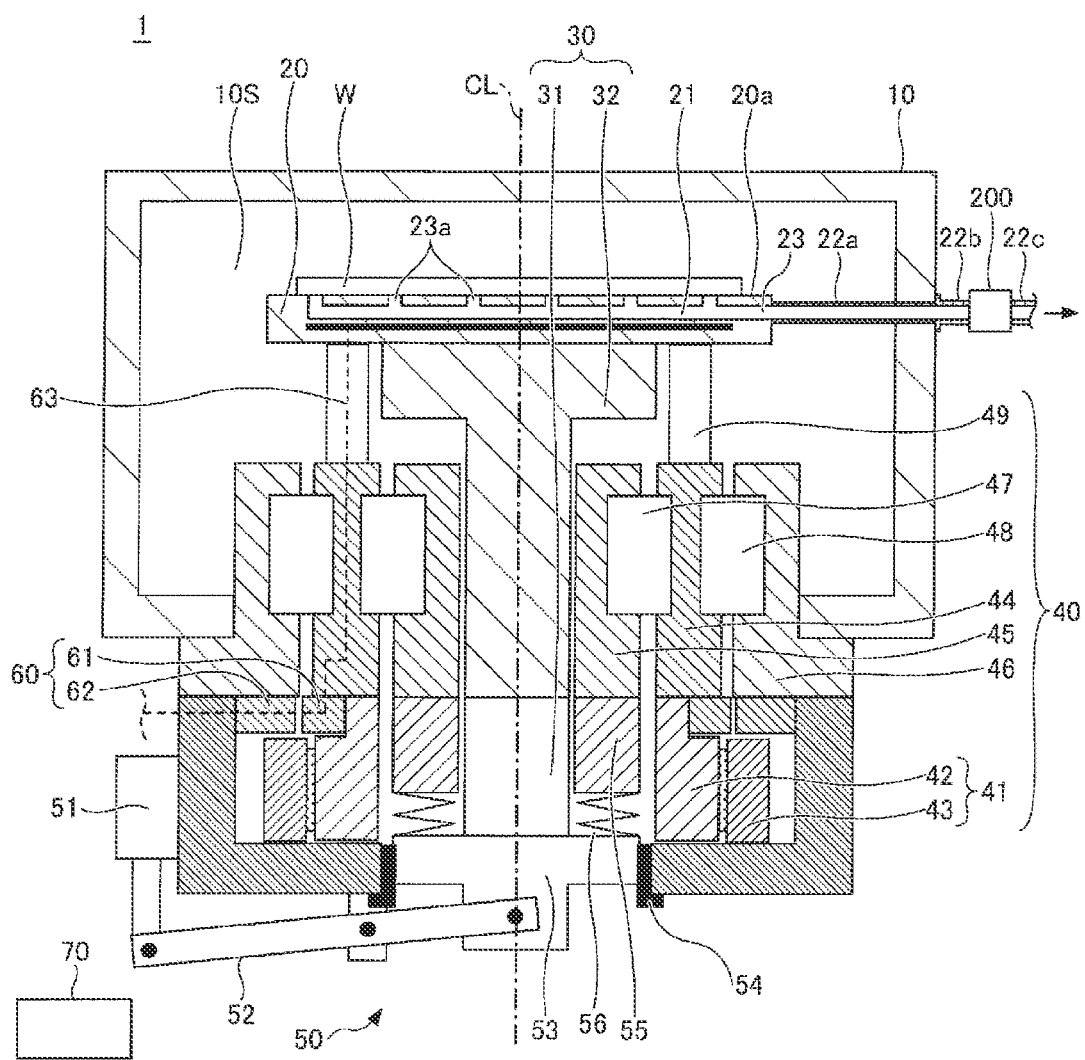
FIG. 2 is a cross-sectional view showing an exemplary configuration when cooling the placing stand of the substrate processing apparatus according to the embodiment.

An example of a substrate processing apparatus 1 according to one embodiment will be described with reference to FIGS. 1 and 2. FIG. 1 is a cross-sectional view showing an exemplary configuration when a placing stand of the substrate processing apparatus 1 according to one embodiment is rotated. FIG. 2 is a cross-sectional view showing an exemplary configuration when cooling the placing stand of the substrate processing apparatus 1 according to one embodiment.

The substrate processing apparatus 1 may be, for example, a substrate processing apparatus (e.g., a chemical vapor deposition (CVD) apparatus, an atomic layer deposition (ALD) apparatus, or the like) which supplies a processing gas into a processing chamber 10 and performs a desired processing (e.g., film formation processing or the like) on a substrate W. Further, the substrate processing apparatus 1 may be, for example, a substrate processing apparatus (e.g., a physical vapor deposition (PVD) apparatus or the like) which supplies a processing gas into the processing chamber 10 and sputters a target provided in the processing chamber 10 to perform a desired processing (e.g., film formation processing or the like) on the substrate W.

The substrate processing apparatus 1 comprises the processing chamber 10, a placing stand 20 on which the substrate W is placed inside the processing chamber 10, a freezing device 30, a rotating device 40 for rotating the placing stand 20, and a raising and lowering device 50 for raising and lowering the freezing device 30. The substrate processing apparatus 1 further comprises a slip ring 60 for supplying power to a chuck electrode 21 of the rotating placing stand 20. The substrate processing apparatus 1 further comprises a control device 70 for controlling various devices such as the freezing device 30, the rotating device 40, the raising and lowering device 50, and the like.

The processing chamber 10 forms an inner space 10S. The processing chamber 10 is configured such that the inner space 10S thereof is decompressed to a high vacuum by operating an exhaust device (not shown), such as a vacuum pump. Further, the processing chamber 10 is configured to be supplied with a desired processing gas used for substrate processing through a gas supply pipe (not shown) communicating with a processing gas supply device (not shown).

The placing stand 20, on which the substrate W is placed, is provided inside the processing chamber 10. The placing stand 20 is made of a material having a high thermal conductivity (for example, Cu). The placing stand 20 includes an electrostatic chuck. The electrostatic chuck has the chuck electrode 21 embedded in a dielectric film. A predetermined potential is applied to the chuck electrode 21 via the slip ring 60 and a wiring 63, which will be described later. With this configuration, the substrate W can be held (fixed) on an upper surface of the placing stand 20 by attracting the substrate W with the electrostatic chuck.

A gas path 23 is formed inside the placing stand 20. A proximal end of the gas path 23 is connected to a gas supply pipe 22a. A tip end of the gas path 23 is formed into a plurality of gas holes 23a open to a placing surface 20a on which the substrate W is placed. The gas supply pipe 22a passes through a side wall of the processing chamber 10 and is connected to a gas supply pipe 22b outside the processing chamber 10. A heat transfer gas (backside gas) is blown through the gas supply pipes 22a and 22b and the gas path 23 to a back surface of the substrate W. Examples of the heat transfer gas include, but are not limited to, He gas and $N_2$ gas.

The gas supply pipe 22b is connected to a gas supply pipe 22c through a cooling part 200, and the gas supply pipe 22c is connected to a gas utility equipment 300 in the factory.

Figure 3:
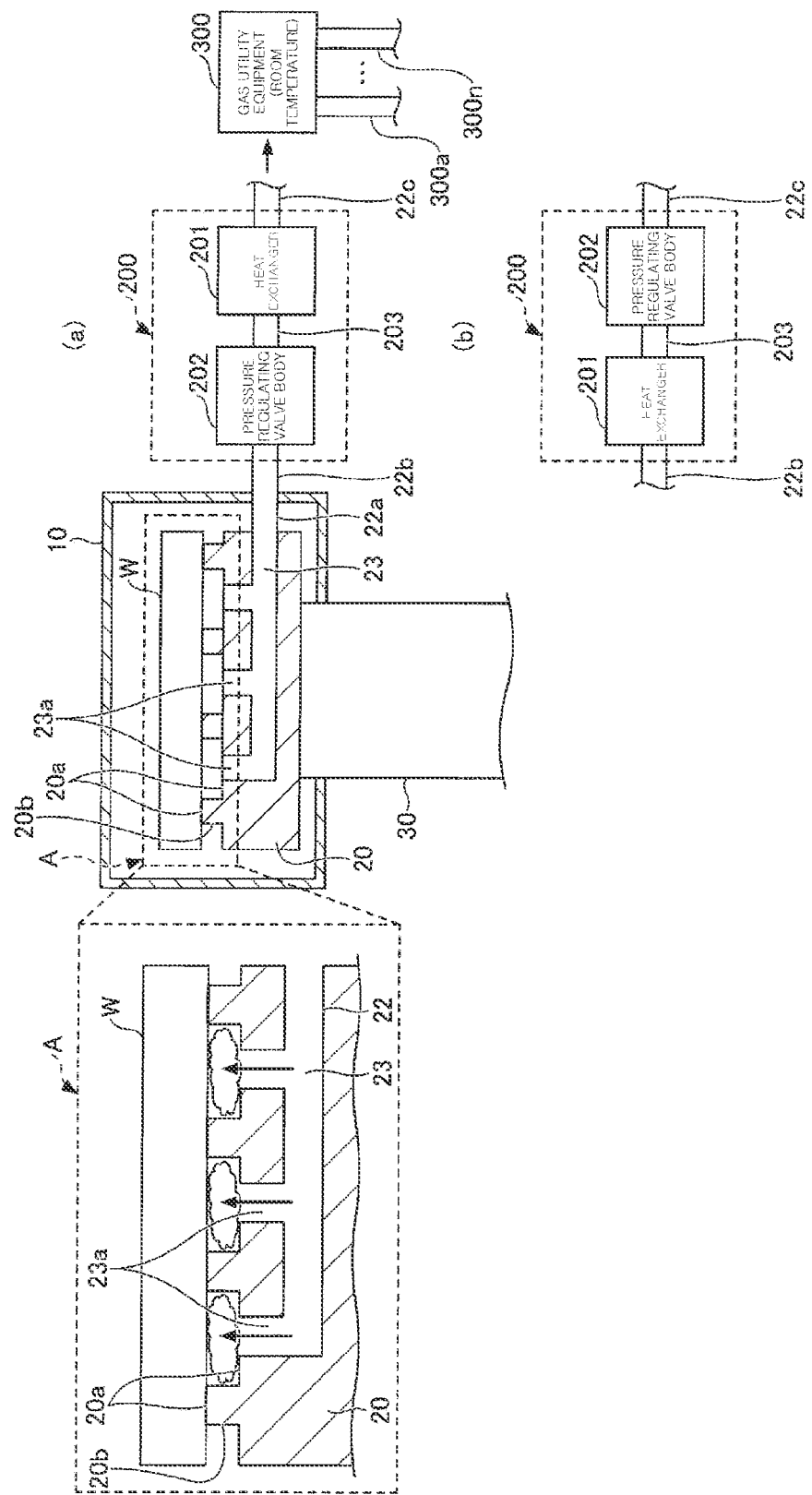
FIG. 3 is a diagram showing an example of a cooling part of the substrate processing apparatus according to the embodiment.

The cooling part 200 is disposed outside the processing chamber 10 and at a position close to the processing chamber 10 via the gas supply pipe 22b. As shown in FIG. 3, the cooling part 200 has a heat exchanger 201 and a pressure regulating valve body (electromagnetic valve) 202, and cools the heat transfer gas supplied between the back surface of the substrate W and the placing surface 20a of the placing stand 20. Details of the cooling part 200 will be described later.

The freezing device 30 is provided below the placing stand 20. The freezing device 30 is configured by stacking a freezing machine 31 and a freezing heat medium 32. The freezing heat medium 32 may also be referred to as a cold link. The freezing machine 31 holds the freezing heat medium 32 and cools an upper surface of the freezing heat medium 32 to an extremely low temperature. From the point of view of cooling capacity, the freezing machine 31 preferably uses a Gifford-McMahon (GM) cycle. The freezing heat medium 32 is fixed on the freezing machine 31 and its upper portion is accommodated inside the processing chamber 10. The freezing heat medium 32 is made of a material having a high thermal conductivity (for example, Cu) or the like, and has a substantially cylindrical outer shape. The freezing heat medium 32 is disposed so that its center coincides with a center axis CL of the placing stand 20.

Further, the placing stand 20 is rotatably supported by the rotating device 40. The rotating device 40 has a rotation driving device 41, a fixed shaft 45, a rotating shaft 44, a housing 46, magnetic fluid seals 47 and 48, and a stand 49.

The rotation driving device 41 is a direct drive motor having a rotor 42 and a stator 43. The rotor 42 has a substantially cylindrical shape extending coaxially with the rotating shaft 44 and is fixed to the rotating shaft 44. The stator 43 has a substantially cylindrical shape with an inner diameter larger than an outer diameter of the rotor 42. The rotation driving device 41 may be in a form other than a direct drive motor, and may be in a form including a servomotor and a transmission belt.

The rotating shaft 44 has a substantially cylindrical shape extending coaxially with the center axis CL of the placing stand 20. The fixed shaft 45 is provided inside the rotating shaft 44 in a radial direction. The fixed shaft 45 has a substantially cylindrical shape extending coaxially with the center axis CL of the placing stand 20. The housing 46 is provided outside the rotating shaft 44 in a radial direction. The housing 46 has a substantially cylindrical shape extending coaxially with the center axis CL of the placing stand 20 and is fixed to the processing chamber 10.

Further, the magnetic fluid seal 47 is provided between an outer peripheral surface of the fixed shaft 45 and an inner peripheral surface of the rotating shaft 44. The magnetic fluid seal 47 rotatably supports the rotating shaft 44 with respect to the fixed shaft 45 and seals between the outer peripheral surface of the fixed shaft 45 and the inner peripheral surface of the rotating shaft 44 to separate the inner space 10S of the decompressible processing chamber 10 from the outer space of the processing chamber 10. Further, the magnetic fluid seal 48 is provided between an inner peripheral surface of the housing 46 and an outer peripheral surface of the rotating shaft 44. The magnetic fluid seal 48 rotatably supports the rotating shaft 44 with respect to the housing 46 and seals between the inner peripheral surface of the housing 46 and the outer peripheral surface of the rotating shaft 44 to separate the inner space 10S of the decompressible processing chamber 10 from the outer space of the processing chamber 10. Accordingly, the rotating shaft 44 is rotatably supported by the fixed shaft 45 and the housing 46.

Further, the freezing heat medium 32 is inserted through the radially inner side of the fixed shaft 45. The stand 49 is provided between the rotating shaft 44 and the placing stand 20 and is configured to transmit the rotation of the rotating shaft 44 to the stand 49.

With the above configuration, when the rotor 42 of the rotation driving device 41 rotates, the rotating shaft 44, the stand 49, and the placing stand 20 rotate relative to the freezing heat medium 32 in the X1 direction shown in FIG. 1.

Further, the freezing device 30 is supported by the raising and lowering device 50 so as to be raised and lowered. The raising and lowering device 50 has an air cylinder 51, a link mechanism 52, a freezing device support 53, a linear guide 54, a fixed portion 55, and a bellows 56.

The air cylinder 51 is a mechanical device whose rod moves linearly by air pressure. The link mechanism 52 converts the linear motion of the rod of the air cylinder 51 into vertical motion of the freezing device support 53. Further, the link mechanism 52 has a lever structure, one end of which is connected to the air cylinder 51 and the other end of which is connected to the freezing device support 53. Accordingly, a large pressing force can be generated with a small thrust of the air cylinder 51. The freezing device support 53 supports the freezing device 30 (the freezing machine 31 and the freezing heat medium 32). Further, the moving direction of the freezing device support 53 is guided in the vertical direction by the linear guide 54.

The fixed portion 55 is fixed to a lower surface of the fixed shaft 45. The substantially cylindrical bellows 56 surrounding the freezing machine 31 is provided between a lower surface of the fixed portion 55 and an upper surface of the freezing device support 53. The bellows 56 is a metal bellows structure which is vertically expandable. Accordingly, the fixed portion 55, the bellows 56, and the freezing device support 53 seal between an inner peripheral surface of the fixed shaft 45 and an outer peripheral surface of the freezing heat medium 32 to separate the inner space 10S of the decompressible processing chamber 10 from the outer space of the processing chamber 10. Further, a lower surface side of the freezing device support 53 is adjacent to the outer space of the processing chamber 10, and a region surrounded by the bellows 56 on the upper surface side of the freezing device support 53 is adjacent to the inner space 10S of the processing chamber 10.

The slip ring 60 is provided below the rotating shaft 44 and the housing 46. The slip ring 60 has a rotating body 61 including a metal ring and a fixed body 62 including a brush. The rotating body 61 has a substantially cylindrical shape extending coaxially with the rotating shaft 44, and is fixed to a lower surface of the rotating shaft 44. The fixed body 62 has a substantially cylindrical shape with an inner diameter slightly larger than an outer diameter of the rotating body 61, and is fixed to a lower surface of the housing 46. The slip ring 60 is electrically connected to a DC power supply (not shown) and supplies power supplied from the DC power supply to the wiring 63 via the brush of the fixed body 62 and the metal ring of the rotating body 61. With this configuration, a potential can be applied from the DC power supply to the chuck electrode 21 without twisting the wiring 63 or the like. The structure of the slip ring 60 may be a structure other than the brush structure, for example, a contactless power supply structure, a mercury-free structure, a structure containing a conductive liquid, or the like.

The control device 70 is, for example, a computer and includes a central processing unit (CPU), a random access memory (RAM), a read only memory (ROM), an auxiliary storage device, and the like. The CPU operates based on a program stored in the ROM or the auxiliary storage device and controls the operation of the substrate processing apparatus 1. The control device 70 may be provided inside the substrate processing apparatus 1 or outside the substrate processing apparatus 1. When the control device 70 is provided outside the substrate processing apparatus 1, the control device 70 can control the substrate processing apparatus 1 by communication means such as wired or wireless communication.

The substrate processing apparatus 1 of the present disclosure is suitable, for example, for film formation processing on a substrate at an extremely low temperature. For example, MTJ elements used in MRAM and HDD heads are composed of multi-layered thin films using several kinds of materials. Among them, a magnetic layer, which is important for obtaining good MRAM characteristics, is formed while cooling the substrate to an extremely low temperature in order to promote amorphization of a crystal structure. At this time, the substrate processing apparatus 1 of the present disclosure cools the placing stand 20 by bringing it into contact with the freezing heat medium 32 as shown in FIG. 2. Accordingly, the placing stand 20 can be cooled to an extremely low temperature in a short period of time with high precision, and the substrate W can be cooled to an extremely low temperature by the cooled placing stand 20.

However, during substrate processing, in order to rotate the placing stand 20 on which the substrate W is placed, the placing stand 20 is separated from the freezing heat medium 32 as shown in FIG. 1. Further, the heated substrate W is placed on the placing stand 20. Accordingly, the temperature of not only the substrate W but also of the placing stand 20 rises. In order to maintain the uniformity of the substrate processing, it is necessary to return the temperature of the placing stand 20, which has been raised due to the loading of the substrate, to the original temperature.

Figure 4:
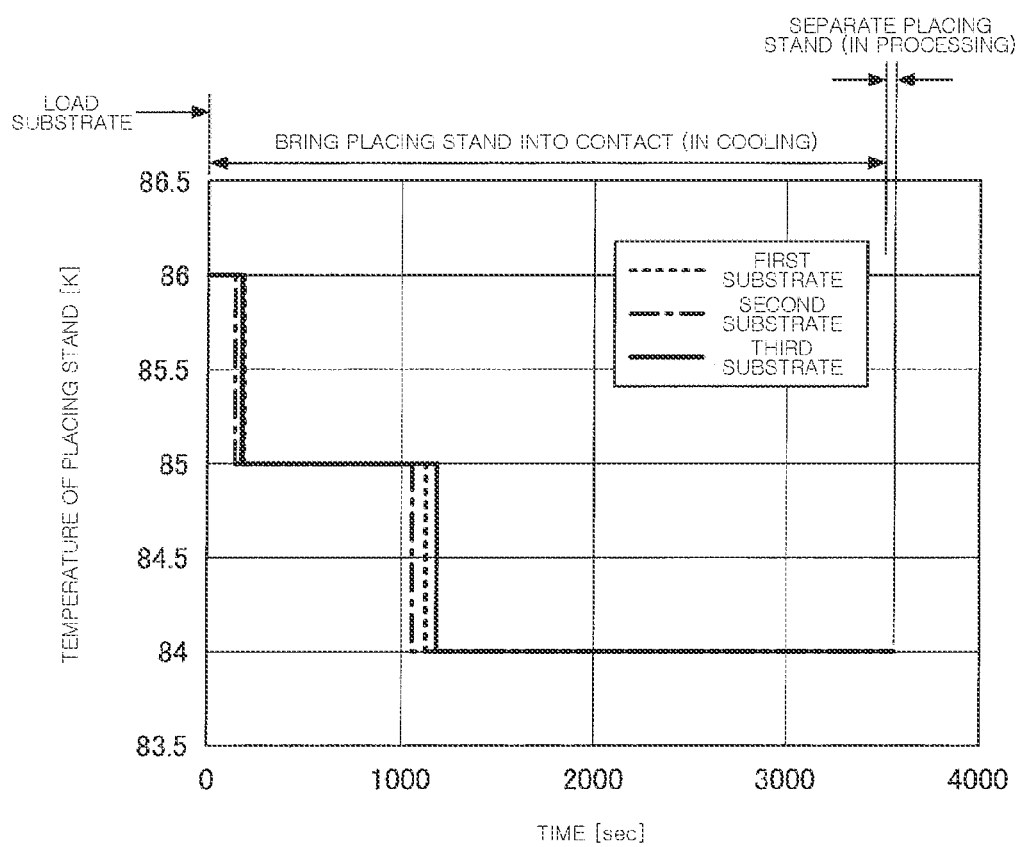
FIG. 4 is a diagram showing an example of the time required to cool the placing stand, whose temperature has risen due to substrate processing, to an initial cooling temperature.

The placing stand 20, whose temperature has risen, is cooled by bringing the placing stand 20 into contact with the freezing heat medium 32 prior to the film formation processing for a next substrate W. However, it has been found that it takes about 20 minutes to cool the placing stand 20 to a desired temperature (initial cooling temperature) as shown in FIG. 4.

Description will be made with reference to FIG. 4, which shows an example of the time for cooling the placing stand 20, the temperature of which has risen due to the substrate processing, to the initial cooling temperature. In the example of FIG. 4, it can be seen that when the substrate W is placed on the placing stand 20 at 84 K and the temperature of the placing stand 20 rise to 86 K, it takes about 20 minutes (1200 sec) to bring the freezing heat medium 32 into contact with the placing stand 20 and to cool it back to the original 84 K.

Figure 5:
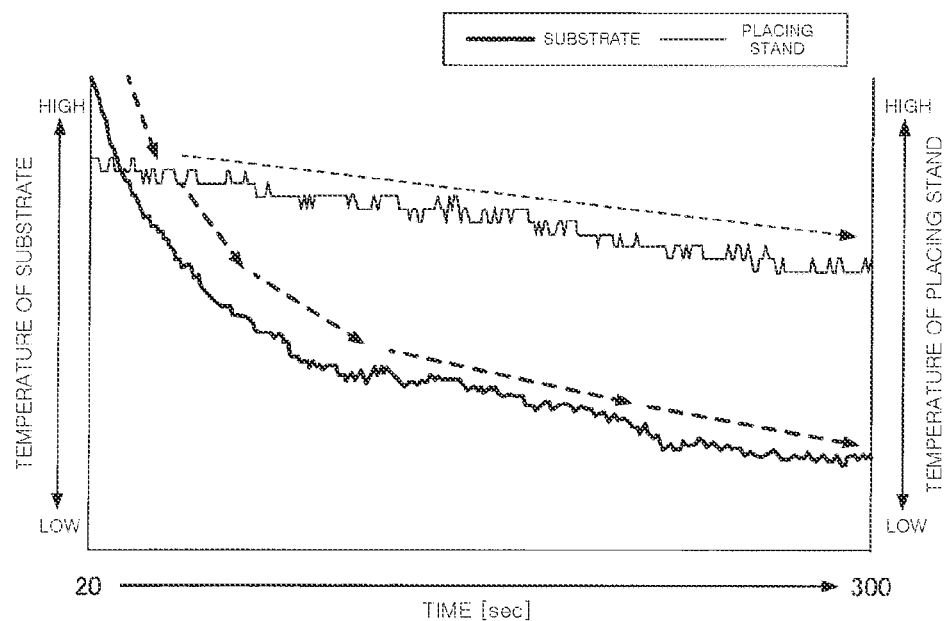
FIG. 5 is a diagram showing a specific example of cooling the placing stand and the substrate whose temperature has risen due to the substrate processing.

FIG. 5 is a diagram showing a specific example of cooling the placing stand 20, whose temperature has risen rapidly after the substrate W is placed thereon, and the substrate W. The horizontal axis of FIG. 5 indicates the time after the substrate W is placed on the placing stand 20, the vertical axis (right) indicates the temperature of the placing stand 20, and the vertical axis (left) indicates the temperature of the substrate W. The temperature of the placing stand 20 and the temperature of the substrate W, which have risen rapidly, did not drop rapidly but gradually dropped within 20 to 300 seconds after the substrate W, whose temperature has risen due to the substrate processing, was placed.

Therefore, when continuous processing is performed in a normal sequence, the temperature of the placing stand 20 cannot be completely cooled down to the initial cooling temperature during continuous substrate processing, or it takes tens of minutes to cool down to the initial cooling temperature, which is a factor that reduces the throughput of the substrate processing.

Therefore, conventionally, a room temperature heat transfer gas is introduced between the substrate W and the placing stand 20 to promote heat transfer between the substrate W and the placing stand 20, but the substrate W is cooled and heated at the same time by blowing the room temperature heat transfer gas.

Figure 6:
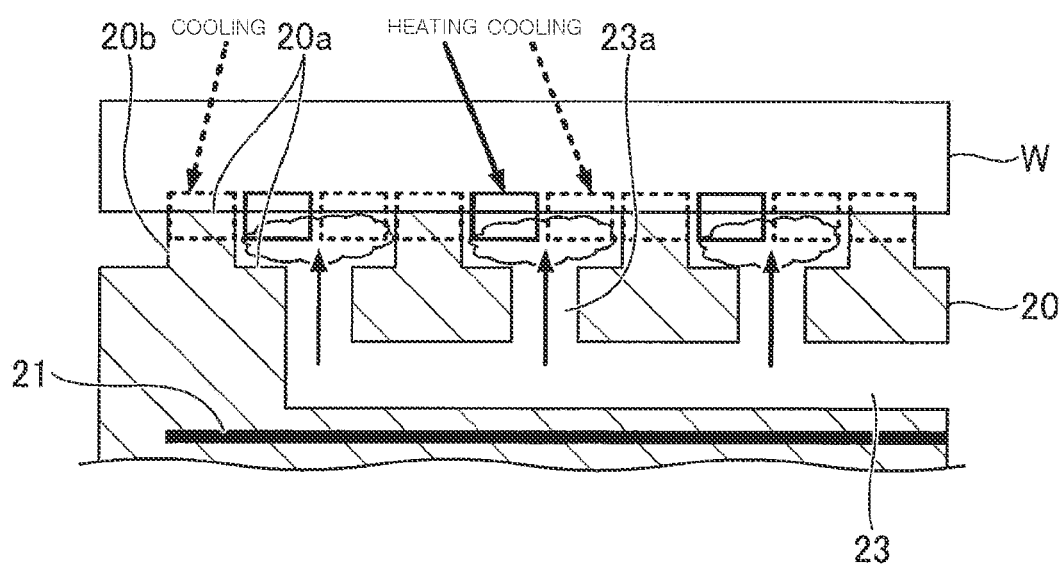
FIG. 6 is a schematic diagram of cooling and heating when a room temperature heat transfer gas is introduced between the substrate and the placing stand.

FIG. 6 is a diagram schematically showing cooling and heating when a room temperature heat transfer gas is introduced between the substrate W and the placing stand 20. FIG. 6 macroscopically shows a portion between the substrate W and the placing stand 20. The placing surface 20a of the placing stand 20 is embossed to form convex portions 20b. During cooling, by applying a DC voltage to the chuck electrode 21 and electrostatically attracting the substrate W, the back surface of the substrate W is brought into contact with the placing surface 20a, thereby removing the heat of the substrate W and cooling the substrate W.

Further, the room temperature heat transfer gas introduced from the gas hole 23a into a space between the convex portions 20b (space between the substrate W and the placing stand 20) increases the efficiency of heat transfer between the substrate W and the placing stand 20, which also cools the substrate W. On the other hand, since the heat transfer gas is at room temperature, the heat is applied to the substrate W and the placing stand 20 by blowing the heat transfer gas toward the back surface of the substrate W, and the substrate W is heated at the same time.

In other words, since the heat transfer gas is a mixture of cold gas and warm gas, the substrate W is considered to be both cooled and heated by the blowing of the heat transfer gas. Therefore, from a macroscopic point of view, the poor cooling efficiency between the substrate W and the placing stand 20 causes an increase in the recovery time for cooling the placing stand 20 to a desired temperature.

Therefore, in the substrate processing apparatus 1 according to the present disclosure, by using the cooling part 200 for lowering the temperature of the heat transfer gas flowing between the substrate W and the placing stand 20, the cooling efficiency between the substrate W and the placing stand 20 is increased. The cooling part 200 that lowers the temperature of the heat transfer gas will be described with reference to FIG. 3.

As shown in (a) of FIG. 3, the gas supply pipe 22b is connected to the gas supply pipe 22c through the cooling part 200, and the gas supply pipe 22c is connected to the gas utility equipment 300 in the factory. The cooling part 200 includes the heat exchanger 201 and the pressure regulating valve body (electromagnetic valve) 202 for an extremely low temperature. In (a) of FIG. 3, the pressure regulating valve body (electromagnetic valve) 202 is connected to the gas supply pipe 22b on the side of the processing chamber 10, and the heat exchanger 201 is connected to the gas supply pipe 22c on the side of the gas utility equipment 300. The heat exchanger 201 and the pressure regulating valve body (electromagnetic valve) 202 are connected through a gas supply pipe 203 inside the cooling part 200.

However, the present disclosure is not limited thereto, and as shown in (b) of FIG. 3, the heat exchanger 201 may be connected to the gas supply pipe 22b on the side of the processing chamber 10, and the pressure regulating valve body (electromagnetic valve) 202 may be connected to the gas supply pipe 22c on the side of the gas utility equipment 300. In this case, the pressure regulating valve body (electromagnetic valve) 202 is replaced with a pressure regulating valve body for room temperature instead of the pressure regulating valve body for extremely low temperature. In the following description, the description is continued with the configuration of (a) of FIG. 3 as an example.

The heat transfer gas that passes from the gas utility equipment 300 through the gas supply pipe 22c and enters the heat exchanger 201 is at room temperature. The heat exchanger 201 cools the incoming room temperature heat transfer gas. Heat is removed from the heat transfer gas by the heat exchanger 201 so that the heat transfer gas is cooled. The heat removed by the heat exchanger 201 is exhausted. For example, the temperature of the heat transfer gas is reduced from room temperature to about 150 K or less in the heat exchanger 201. The cooled heat transfer gas is sent to the pressure regulating valve body (electromagnetic valve) 202 through the gas supply pipe 203. In this case, the pressure regulating valve body (electromagnetic valve) 202 is a pressure regulating electromagnetic valve for an extremely low temperature. The pressure regulating valve body (electromagnetic valve) 202 controls the flow rate of the cooled heat transfer gas to adjust the pressure between the substrate W and the placing stand 20.

The cooled heat transfer gas, the flow rate of which has been adjusted, is blown from the plurality of gas holes 23a through the gas supply pipe 22b, the gas supply pipe 22a, and the gas path 23 in the placing stand 20 into the space between the substrate W and the placing stand 20.

With such a configuration, in the substrate processing apparatus 1 of the present disclosure, the temperature of the heat transfer gas flowing between the substrate W and the placing stand 20 when the substrate W is electrostatically attracted can be lowered. As a result, the amount of heat transferred from the heat transfer gas to the substrate W can be reduced, and the heating of the substrate W due to the blowing of the heat transfer gas can be suppressed. As a result, the cooling efficiency between the substrate W and the placing stand 20 is increased, and the recovery time for cooling the placing stand 20, whose temperature has increased due to the substrate processing, to a desired temperature can be shortened.

In the case of the heat transfer gas at room temperature shown in FIG. 6, when the heat transfer gas absorbs thermal energy from the substrate W to cool the substrate W, when the temperature of the heat transfer gas exceeds the temperature of the substrate W due to the absorption of a certain amount of thermal energy by the heat transfer gas, a phenomenon occurs in which the substrate W is heated by the heat transfer gas. In other words, the temperature of the heat transfer gas is not uniform so that hot and cold portions are generated, and the heat transfer gas cools a portion of the substrate W and heats another portion of the substrate W.

On the other hand, in the substrate processing apparatus 1 of the present disclosure, the heat transfer gas whose temperature is lowered is supplied between the substrate W and the placing stand 20. As the heat transfer gas whose temperature is lowered, a heat transfer gas having an extremely low temperature of about 150 K or less is supplied between the substrate W and the placing stand 20. As a result, without the heat transfer gas heating the substrate W, all the thermal energy of the substrate W can be transferred to the side of the placing stand 20 (freezing heat medium 32), and the cooling efficiency of the substrate W can be improved. As a result, the recovery time can be shortened to a time that does not affect production processes such as substrate processing.

The gas utility equipment 300 is connected to the gas supply pipe 22c and is also connected to other pipes 300a to 300n to supply gas to various devices through each pipe. Further, the length of the gas supply pipe 22c is considerably longer than that of the gas supply pipes 22a and 22b. Therefore, from the viewpoint of preventing dew condensation, supplying gas to other branched devices, or the like, it is difficult to uniformly lower the temperature of the gas on the side of the gas utility equipment 300 and to supply the heat transfer gas whose temperature has been lowered from the gas utility equipment 300.

Therefore, the substrate processing apparatus 1 of the present disclosure has the cooling part 200 outside the processing chamber 10, and the cooling part 200 cools the heat transfer gas. At this time, it is necessary to take countermeasures against dew condensation when the heat transfer gas whose temperature has been lowered flows through the gas supply pipes 22a and 22b. Therefore, the cooling part 200 is disposed at a position close to the processing chamber 10 so that the gas supply pipes 22a and 22b connected to the gas path 23 are not condensed by the cooled heat transfer gas. Further, the cooling part 200 is directly connected to the gas path 23 via the gas supply pipes 22a and 22b, and the distance between the gas supply pipes 22a and 22b is made as short as possible.

[Substrate Processing Method]

Figure 7:
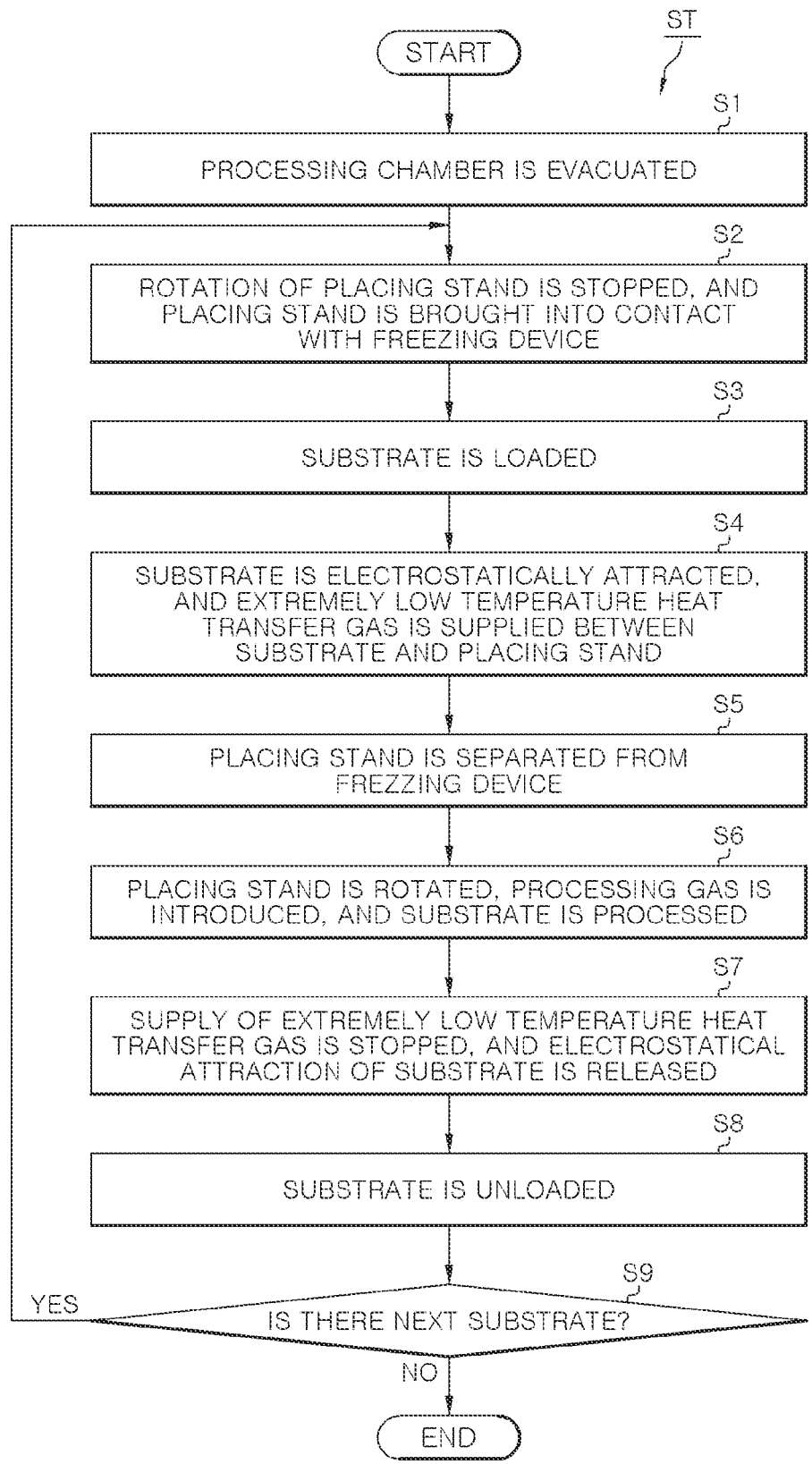
FIG. 7 is a flow chart showing an example of a substrate processing method according to the embodiment.

Next, a substrate processing method ST according to the embodiment will be described with reference to FIG. 7. FIG. 7 is a flow chart showing an example of the substrate processing method ST according to the embodiment. The substrate processing method ST is automatically performed using the substrate processing apparatus 1 under the control of the control device 70.

First, the processing chamber 10 is evacuated (step S1). Then, the rotation of the placing stand 20 is stopped by stopping the rotating device 40, and the raising and lowering device 50 is controlled to bring the placing stand 20 and the freezing device 30 (freezing heat medium 32) into contact (step S2: see FIG. 2). Accordingly, the placing stand 20 and the substrate W to be later placed on the placing stand 20 are cooled.

Here, if the pressing force for pressing the freezing heat medium 32 against the placing stand 20 is insufficient, heat conduction loss occurs and the cooling capacity of the placing stand 20 becomes insufficient. On the other hand, in the substrate processing apparatus 1, by using the raising and lowering device 50, the upper surface (contact surface) of the freezing heat medium 32 directly contacts a lower surface (surface to be contacted) of the placing stand 20, and the freezing heat medium 32 comes into contact with the placing stand 20 and stops. As a result, the freezing heat medium 32 is in direct contact with the placing stand 20 so that the cooling performance for the placing stand 20 can be improved.

Next, the substrate W is transferred into the processing chamber 10 and placed on the placing stand 20 (step S3). Then, a DC voltage is applied to the chuck electrode 21 to electrostatically attract the substrate W, and a heat transfer gas cooled to an extremely low temperature by the cooling part 200 is supplied (step S4). The heat transfer gas is blown onto the back surface of the substrate W from the gas supply pipes 22a and 22b and the gas path 23. Since the temperature of the heat transfer gas is lowered in the cooling part 200, the cooling efficiency of the substrate W can be improved.

Next, the control device 70 controls the raising and lowering device 50 to separate the placing stand 20 from the freezing device 30 (freezing heat medium 32) (step S5: see FIG. 1), controls the rotating device 40 to rotate the placing stand 20 on which the substrate W is placed, introduces the processing gas, and processes the substrate W (step S6). Accordingly, the in-plane uniformity of the substrate processing (e.g., film formation processing or the like) can be improved.

After the substrate processing, the supply of the extremely low temperature heat transfer gas is stopped, the supply of power to the chuck electrode 21 is stopped, and the attraction of the placing stand 20 is released (step S7). Then, the substrate W is separated from the placing stand 20 by raising and lowering pins (not shown), and the substrate W is unloaded (step S8).

Next, it is determined whether or not there is a next substrate W (step S9), and if there is a next substrate W, the processing returns to step S2, and the placing stand 20 is cooled during the waiting time until the next substrate W is loaded by bringing the placing stand 20 and the freezing device 30 (freezing heat medium 32) into contact with each other by the raising and lowering device 50. Steps S2 to S9 are repeated until it is determined that there is no next substrate W in step S9, and when it is determined that there is no next substrate W in step S9, this processing is terminated.

As described above, according to the substrate processing method and the substrate processing apparatus of the present embodiment, the cooling efficiency between the substrate W and the placing stand 20 can be improved.

It should be considered that the embodiments disclosed this time are illustrative in all respects and not restrictive. The above-described embodiments may be changed and modified in various ways without departing from the scope and spirit of the appended claims. The above-described embodiments may include other configurations without contradiction and may be combined without contradiction.

The invention claimed is:

1. A substrate processing method for a substrate processing apparatus,
   wherein the substrate processing apparatus comprises:
   a processing chamber;
   a placing stand provided inside the processing chamber, configured to place a substrate on a placing surface, and having a gas path;
   a freezing device having a contact surface to be in contact with or separated from a surface to be contacted of the placing stand and configured to cool the placing stand;
   a gas supply pipe connected to the gas path and configured to introduce a heat transfer gas; and
   a cooling part provided outside the processing chamber and connected to the gas supply pipe,
   the substrate processing method comprising:
   (a) cooling the heat transfer gas by the cooling part; and
   (b) supplying the cooled heat transfer gas between the placing surface and a back surface of the substrate from the gas path through the gas supply pipe.

2. The substrate processing method of claim 1, wherein the cooling part includes a heat exchanger and a pressure regulating valve body, and
   said (a) comprises:
   cooling the heat transfer gas with the heat exchanger; and
   adjusting a flow rate of the heat transfer gas with the pressure regulating valve body.

3. The substrate processing method of claim 1, wherein the substrate processing apparatus comprises a raising and lowering device configured to raise and lower the freezing device to bring or separate the surface to be contacted of the placing stand into contact with or from the contact surface of the freezing device, and
   the substrate processing method further comprises:
   (c) bringing the surface to be contacted of the placing stand into contact with the contact surface of the freezing device by the raising and lowering device,
   wherein said (a) is performed after said (c).

4. The substrate processing method of claim 1, wherein the substrate processing apparatus comprises a rotating device configured to rotatably support the placing stand, and
   the substrate processing method further comprises:
   (d) separating the surface to be contacted of the placing stand from the contact surface of the freezing device by the raising and lowering device; and
   (e) rotating the placing stand by the rotating device to process the substrate after said (d).

5. The substrate processing method of claim 1, wherein in said (a), the heat transfer gas is cooled to a temperature of 150 K or less.

6. The substrate processing method of claim 2, wherein the pressure regulating valve body is an electromagnetic valve for an extremely low temperature.

7. The substrate processing method of claim 1, wherein the cooling part is disposed at a position outside the processing chamber and close to the processing chamber so that the gas supply pipe connected to the gas path is not condensed by the cooled heat transfer gas.

8. The substrate processing method of claim 1, wherein the placing stand has a chuck electrode, and
the substrate processing method further comprises:
(f) supplying power to the chuck electrode to attract the substrate to the placing stand,
wherein said (b) is performed after said (f).

9. A substrate processing apparatus comprising:
a processing chamber;
a placing stand provided inside the processing chamber, configured to place a substrate on a placing surface, and having a gas path;
a freezing device having a contact surface to be in contact with or separated from a surface to be contacted of the placing stand and configured to cool the placing stand;
a gas supply pipe connected to the gas path and configured to introduce a heat transfer gas;
a cooling part provided outside the processing chamber and connected to the gas supply pipe; and
a control device,
wherein the control device controls:
(a) cooling the heat transfer gas by the cooling part; and
(b) supplying the cooled heat transfer gas between the placing surface and a back surface of the substrate from the gas path through the gas supply pipe.

* * * * *